United States Patent
Kim et al.

(10) Patent No.: US 11,887,849 B2
(45) Date of Patent: Jan. 30, 2024

(54) METHOD OF FORMING TRANSITION METAL DICHALCOGENIDETHIN FILM AND METHOD OF MANUFACTURING ELECTRONIC DEVICE INCLUDING THE SAME

(71) Applicants: Samsung Electronics Co., Ltd., Suwon-si (KR); RESEARCH & BUSINESS FOUNDATION SUNGKYUNKWAN UNIVERSITY, Gyeonggi-do (KR)

(72) Inventors: Changhyun Kim, Seoul (KR); Sangwoo Kim, Yongin-si (KR); Kyung-Eun Byun, Seongnam-si (KR); Hyeonjin Shin, Suwon-si (KR); Ahrum Sohn, Pyeongtaek-si (KR); Jaehwan Jung, Daejeon (KR)

(73) Assignees: Samsung Electronics Co., Ltd., Gyeonggi-do (KR); Research & Business Foundation, Sungkyunkwan University, Gyeonggi-do (KR)

( * ) Notice: Subject to any disclaimer, the term of this patent is extended or adjusted under 35 U.S.C. 154(b) by 560 days.

(21) Appl. No.: 17/012,661

(22) Filed: Sep. 4, 2020

(65) Prior Publication Data
US 2021/0074543 A1 Mar. 11, 2021

(30) Foreign Application Priority Data
Sep. 10, 2019 (KR) .................. 10-2019-0112370

(51) Int. Cl.
*H01L 21/02* (2006.01)
*C23C 14/34* (2006.01)
(Continued)

(52) U.S. Cl.
CPC ........ *H01L 21/02631* (2013.01); *C23C 14/06* (2013.01); *C23C 14/34* (2013.01);
(Continued)

(58) Field of Classification Search
None
See application file for complete search history.

(56) References Cited

U.S. PATENT DOCUMENTS

| 9,963,343 B2 * | 5/2018 | Kim .................. H01L 21/0262 |
| 10,741,389 B2 | 8/2020 | Kim et al. |
| 2017/0098717 A1 * | 4/2017 | Yeh ..................... H01L 27/1203 |

FOREIGN PATENT DOCUMENTS

| KR | 10-2017-0058576 A | 5/2017 |
| KR | 101800363 B1 | 11/2017 |
| KR | 10-2019-0063064 A | 6/2019 |

OTHER PUBLICATIONS

Huang et al. "Large-area few-layer MoS2 deposited by sputtering" 2016, Mater. Res. Express, vol. 3, 065007 and Supplementary Information (Year: 2016).*

(Continued)

*Primary Examiner* — Bo B Jang
(74) *Attorney, Agent, or Firm* — Harness, Dickey & Pierce, P.L.C.

(57) ABSTRACT

Disclosed herein are a method of forming a transition metal dichalcogenide thin film and a method of manufacturing a device including the same. The method of forming a transition metal dichalcogenide thin film includes: depositing a transition metal dichalcogenide thin film on a substrate; and heat-treating the deposited transition metal dichalcogenide thin film.

19 Claims, 7 Drawing Sheets

(51) Int. Cl.
  *C23C 14/58* (2006.01)
  *C23C 14/06* (2006.01)
  *H01L 29/66* (2006.01)
(52) U.S. Cl.
  CPC .... *C23C 14/5806* (2013.01); *H01L 21/02667* (2013.01); *H01L 29/66969* (2013.01); *H01L 21/02568* (2013.01); *H01L 21/02592* (2013.01); *H01L 21/02595* (2013.01)

(56) References Cited

OTHER PUBLICATIONS

Supplementary Information of Huang et al. (Year: 2016).*
Dolui et al. "Possible doping strategies for MoS2 monolayers: An ab initio study" 2013, Phys. Rev. B 88 075420 (Year: 2013).*
Nitin Choudhary et atl., "Groth of Large-Scale and Thinkness-Modulated MoS2 Nanosheets" Applied Materials & Interfaces, 2014.
Yin et al. "Direct Formation of 2-dimensional Molybdenum Disulfide Thin Films by RF Sputtering and Rapid Thermal Annealing on Sapphire Substrate", Journal of semiconductor technology and science, vol. 18 No. 2, 2018. 4, pp. 153-159.
Huang et al. "Large-area few-layer MoS2 deposited by sputtering", Mater. Res. Express, vol. 3, (2016) 065007.
Ramos et al. "Mechanical Properties of RF-sputtering MoS2 Thin Films", Surf. Topogr.: metrol. prop. 5 (2017) 025003.
Chiappe et al. "Layer-controlled Epitaxy of 2D Semiconductors: Bridging Nanoscale Phenomena to Wafer-Scale Uniformity", Nano technology 29, 425602 (2018).
Gaur et al. "Surface Energy Engineering for Tunable Wettability Through Controlled Synthesis of MoS2", Nano Lett. 14, 4314?4321 (2015).

* cited by examiner

METHOD OF FORMING TRANSITION METAL DICHALCOGENIDE THIN FILM AND METHOD OF MANUFACTURING ELECTRONIC DEVICE INCLUDING THE SAME

CROSS-REFERENCE TO RELATED APPLICATION

This application claims the benefit of Korean Patent Application No. 10-2019-0112370, filed on Sep. 10, 2019, in the Korean Intellectual Property Office, the disclosure of which is incorporated herein in its entirety by reference.

BACKGROUND

1. Field

The present disclosure relates to a method of forming a transition metal dichalcogenide thin film and a method of manufacturing an electronic device including the same.

2. Description of Related Art

Metal dichalcogenides have been researched and developed in various fields such as solar cells, photo-detectors, and light emitting diodes because of their own chemical and physical properties as semiconductor materials.

Generally, in nano-sized materials, as the size of a particle decreases, the ratio of mass to surface of the particle increases, and thus, the surface area of the particle per unit mass increases. In addition, as the energy state of an electron gets closer to that of a molecule, physical properties completely different from those of a bulk material appear. The surface area increase and activation of the nano-sized materials, like the melting point decrease thereof, influences a change in physical properties and influences a change in optical and electrical properties by quantum effects. Thus, the nano-sized materials may be applied to novel optoelectronic materials.

Since nano-sized metal dichalcogenide materials may be applied as biological markers, nonlinear optical materials, light emitting devices, photodetectors, catalysts, chemical sensors, and the like, various methods have been attempted to more efficiently synthesize metal dichalcogenide nanoparticles.

SUMMARY

There is provided a method of forming a transition metal dichalcogenide thin film, by which a transition metal dichalcogenide thin film capable of forming a large area and securing uniformity and high quality may be formed.

There is provided a method of forming a transition metal dichalcogenide thin film, in which a wafer-scaled transition metal dichalcogenide thin film may be formed in a short time.

There is provided a method of manufacturing an electronic device using the above method of forming a transition metal dichalcogenide thin film.

Additional aspects will be set forth in part in the description which follows and, in part, will be apparent from the description, or may be learned by practice of the presented embodiments of the disclosure.

According to an aspect, a method of forming a thin film of transition metal dichalcogenide includes: providing a substrate in a reaction chamber; depositing a transition metal dichalcogenide thin film on the substrate using a sputtering process that uses a precursor and is performed at a first temperature; and heat-treating the transition metal dichalcogenide thin film on the substrate at a second temperature under a chalcogen atmosphere. The precursor may include a transition metal and a chalcogen. The second temperature may be higher than the first temperature.

In some embodiments, the transition metal dichalcogenide thin film may include at least one of an amorphous material and a polycrystalline material.

In some embodiments, the transition metal dichalcogenide thin film may include a composition represented by $MX_{(2-a)}Y_a$ (M is a transition metal element, X is a chalcogen element, Y is an element other than the transition metal and the chalcogen element, and $0 \le a < 2$ is satisfied).

In some embodiments, the depositing the transition metal dichalcogenide thin film may be performed at a temperature of about 500° C. to about 800° C.

In some embodiments, the heat-treating the transition metal dichalcogenide thin film may be performed at a temperature of about 800° C. to about 1200° C.

In some embodiments, the heat-treating the transition metal dichalcogenide thin film may include forming the chalcogen atmosphere by providing a chalcogen-containing gas.

In some embodiments, a process time for depositing the transition metal dichalcogenide thin film may be less than or equal to 2 minutes.

In some embodiments, the depositing the transition metal dichalcogenide thin film may be performed at a pressure of about 0.1 mTorr to about 10 mTorr.

In some embodiments, the heat-treating the transition metal dichalcogenide thin film may provide a heat-treated transition metal dichalcogenide thin film, and the heat-treated transition metal dichalcogenide thin film may have a structure of one layer to fifteen layers.

In some embodiments, the precursor may include at least one of Ti, Zr, Hf, V, Nb, Ta, Mo, W, Tc, Re, Co, Rh, Ir, Ni, Pd, Pt, Zn, and Sn.

In some embodiments, the precursor may include at least one of S, Se, and Te.

In some embodiments, the precursor may include a metal oxide, a metal halide, a metal carbonyl compound, or a combination thereof.

In some embodiments, the heat-treating the transition metal dichalcogenide layer may provide a heat-treated transition metal dichalcogenide thin film and the heat-treated transition metal dichalcogenide thin film may include a composition represented by $MX_2$ (M is a transition metal element, and X is a chalcogen element).

In some embodiments, the precursor may further include an element of Group lower than at least one of the transition metal and the chalcogen.

In some embodiments, the heat-treating the transition metal dichalcogenide layer may provide a heat-treated transition metal dichalcogenide thin film and the heat-treated transition metal dichalcogenide thin film may be doped.

In some embodiments, a thickness of the transition metal dichalcogenide thin film may be proportional to an energy reaction rate of a material sputtered from the precursor.

According to another aspect, a method of manufacturing an electronic device includes forming the thin film of transition metal dichalcogenide using the above-described method; and forming a device unit including the thin film of transition metal dichalcogenide.

In some embodiments, the electronic device may include at least one of a transistor, a diode, an optoelectronic device, a tunneling device, a logic device, and a memory device.

According to an aspect, a method of forming a thin film of transition metal dichalcogenide is provided. The method includes depositing a transition metal dichalcogenide thin film on a substrate by transferring precursor material from a target to the substrate at a first temperature and heat-treating the transition metal dichalcogenide thin film at a second temperature under a chalcogen atmosphere. The second temperature may be higher than the first temperature. The precursor material may include a transition metal and a chalcogen.

In some embodiments, the depositing the transition metal dichalcogenide thin film may be performed at a temperature of about 500° C. to about 800° C.

In some embodiments, the heat-treating the transition metal dichalcogenide thin film may be performed at a temperature of about 800° C. to about 1200° C.

In some embodiments, the heat-treating the transition metal dichalcogenide thin film may include forming the chalcogen atmosphere by providing a chalcogen-containing gas to a reaction chamber while the substrate is in the reaction chamber.

In some embodiments, the transition metal dichalcogenide thin film may include a composition represented by $MX_{(2-a)}Y_a$, where M is a transition metal element, X is a chalcogen element, Y is an element other than the transition metal and the chalcogen element, and $0 \leq a < 2$ is satisfied.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
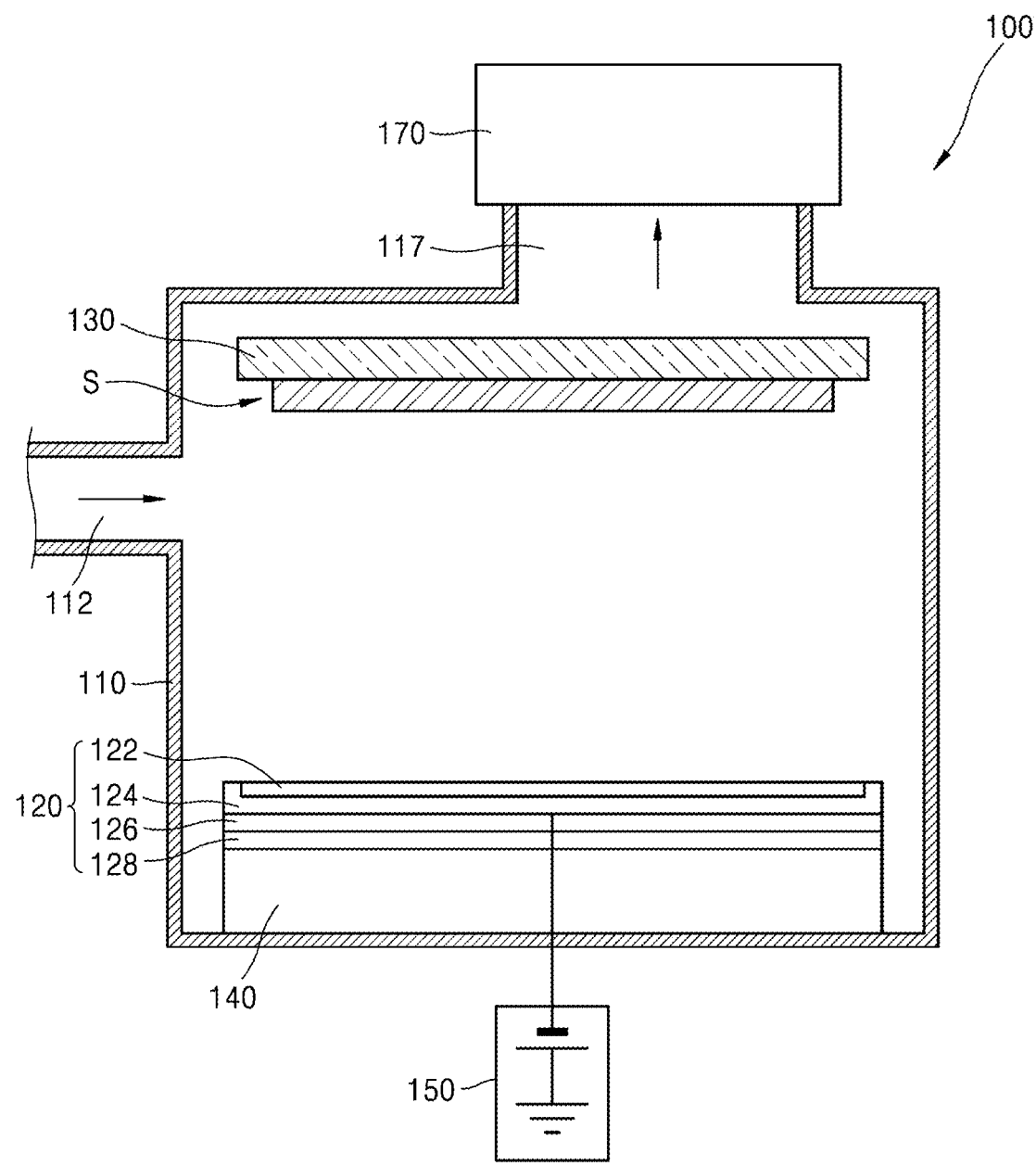
FIG. 1 is a schematic view of a sputtering apparatus according to an embodiment.

Hereinafter, a method of forming a transition metal dichalcogenide thin film according to embodiments, and a method of manufacturing a device including the same will be described in detail with reference to the accompanying drawings. The width and thickness of the layers or regions shown in the accompanying drawings may be exaggerated for clarity and convenience of description. Like numbers refer to like elements throughout the specification.

The terminologies used herein are only for the purpose of describing particular exemplary embodiments, and are not intended to restrict inventive concepts. The singular forms "a," "an" and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them, but do not preclude the presence or addition of one or more other features, integers, steps, operations, elements, components, and/or combinations thereof.

In the drawings, thicknesses are enlarged or reduced in order to clearly express various layers and regions. Like parts are designated by like reference numerals throughout the specification. In the entire specification, when a part of a layer, film, region, plate, etc. is said to be "on" or "over" another part, it includes not only being directly on another part but also having another part therebetween. In the entire specification, although the terms "first," "second," etc. may be used herein to describe various elements, these elements should not be limited by these terms. These terms are only used to distinguish one element from another element.

Although the terms "first," "second," etc. may be used herein to describe various elements, components, regions and/or layers, these elements, components, regions and/or layers should not be limited by these terms.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

In example embodiments, a thin film of transition metal dichalcogenide may be formed using a physical vapor deposition process and a heat-treating process. Hereinafter, examples where the physical vapor deposition process includes a sputtering process is described, but inventive concepts are not limited thereto.

FIG. 1 is a schematic view of a sputtering apparatus according to an embodiment. Referring to FIG. 1, a sputtering apparatus 100 may include a reaction chamber 110 providing a space for a sputtering process, a target 120 disposed in the reaction chamber 110 and mounted with a material to be deposited on a substrate S, a substrate mounting unit 130 (e.g., clamp, electrostatic chuck) facing the target 120 and mounting the substrate S, and a pump 170 connected to an exhaust outlet 117 of the reaction chamber 110.

The reaction chamber 110 may provide a space for performing a sputtering process and a deposition process, may further include a gas inlet 112 supplying reaction gas for generating plasma between a target 122 and the substrate mounting unit 130 and the exhaust outlet 117 for exhausting residual reaction gas, and may easily exhaust residual reaction gas without a separate exhaust pump by connecting the exhaust outlet 117 to the pump 170 for controlling the pressure in the reaction chamber 110. Here, the reaction gas may be argon (Ar) gas capable of generating plasma at low power to limit and/or prevent damage to the substrate S mounted on the substrate mounting unit 130.

The substrate mounting unit 130 mounts the substrate S thereon and supports the substrate S to face the target 120.

A target transport unit 140 may transport the target 120, thereby inducing uniform sputtering on the substrate S. The target transport unit 140 (e.g., movable pedestal) may move the target 120 horizontally or vertically or may rotate the target 120.

In addition, the target 120 is disposed in a region facing the substrate S in the reaction chamber 110. The target 120 may be disposed in parallel to the substrate S while facing the substrate S. The target 120 may include the target 122, a target plate 124, a negative electrode plate 126, and a magnet 128.

The target 122 collides with ions in the reaction chamber 110 generated by the acceleration of electrons, thereby causing a sputtering phenomenon in which a material on the surface of the target 122 is released. The material released from the surface of the target 122 may be formed on the substrate S to form a thin film (not shown). The target 122 may include a precursor including a transition metal and chalcogen. A transition metal dichalcogenide thin film TMD may be formed by the precursor.

The target plate 124 fixes the target 122 that is a supply source of the deposition material formed on the substrate S by sputtering. The negative electrode plate 126 is disposed under the target plate 124, and is connected to a power supply unit 150 to apply a voltage to the target 122. In addition, the magnet 128 applies a magnetic field to limit and/or prevent electrons generated in the plasma from escaping to other parts of the sputtering apparatus 100.

The power supply unit 150 (e.g., circuit) is connected to the negative electrode plate 126 in the reaction chamber 110, thereby generating plasma between the substrate S and the target 122.

Although one target 120 is shown in the drawings, inventive concepts are not limited thereto. A plurality of targets 120 may be provided. One target 120 may be provided with a transition metal precursor, and another target 120 may be provided with a chalcogen precursor. Different voltages from each other may be applied to the respective targets 120.

Figure 2:
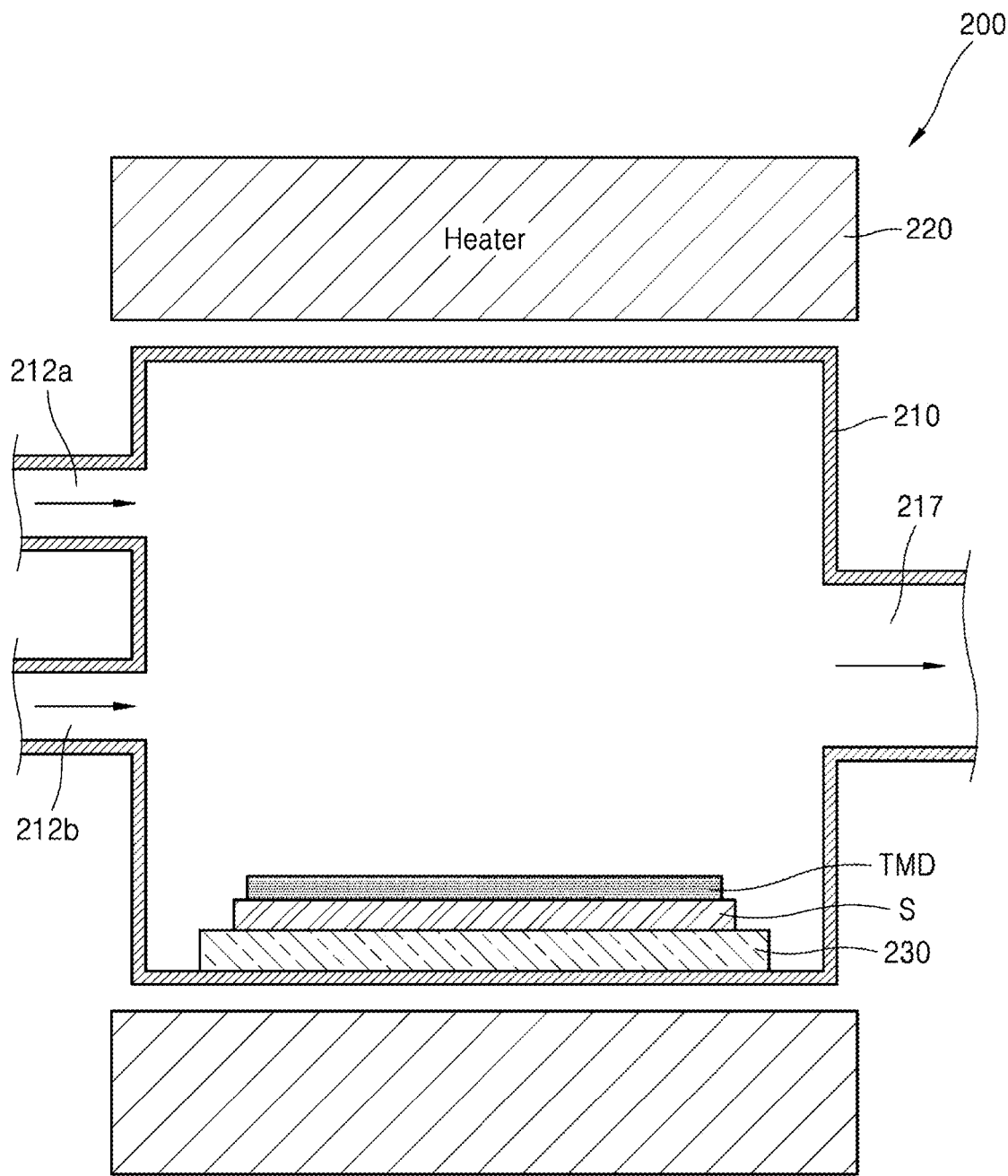
FIG. 2 is a schematic view of a heat treatment apparatus according to an embodiment.

FIG. 2 is a schematic view of a heat treatment apparatus according to an embodiment. Referring to FIG. 2, a heat treatment apparatus 200 may include a chamber 210 for providing a space, and a heater 220 (e.g., resistance heating circuit) for heating the space in the chamber 210. The chamber 210 may include gas inlets 212a and 212b for supplying reaction gas to the space in the chamber 210, an exhaust outlet 217 for exhausting residual reaction gas, and a substrate mounting unit 239 for mounting a substrate. Although it is shown in the drawings that a substrate is disposed in the chamber 210 of the heat treatment apparatus 200, inventive concepts are not limited thereto. The substrate may be disposed, thereby completing the space in the chamber.

Figure 3:
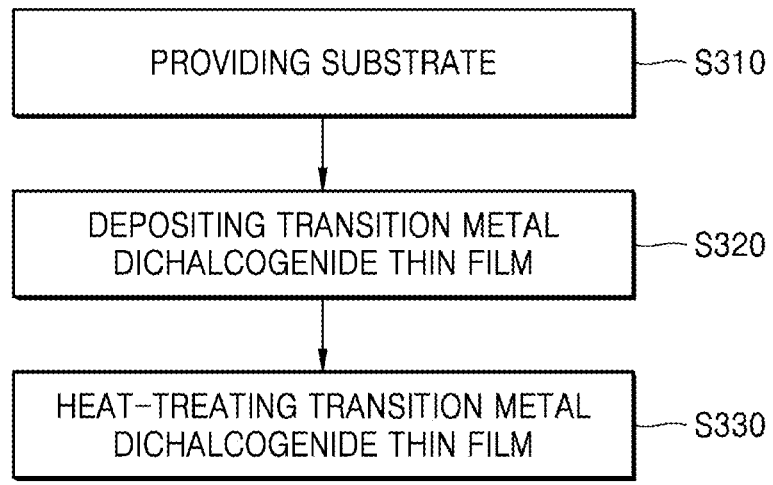
FIG. 3 is a flowchart illustrating a method of forming a transition metal dichalcogenide thin film, according to an embodiment.

FIG. 3 is a flowchart illustrating a method of forming a transition metal dichalcogenide thin film, according to an embodiment.

A substrate is provided in a reaction chamber (S310). The reaction chamber may be reaction chamber for a physical vapor deposition process, such as the reaction chamber 110 of the sputtering apparatus 100 shown in FIG. 1, and the substrate may be provided on the substrate mounting unit 130 in the reaction chamber 110. The substrate may be a substrate capable of growing a transition metal dichalcogenide thin film. For example, the substrate, which is a supporting substrate for growing the transition metal dichalcogenide thin film, may include at least one selected from silicon, silicon oxide, aluminum oxide, magnesium oxide, silicon carbide, silicon nitride, glass, quartz, sapphire, graphite, graphene, a polyimide copolymer, polyimide, polyethylene naphthalate (PEN), a fluoropolymer (FEP), and polyethylene terephthalate (PET). Alternatively, as the substrate, a silicon (Si) substrate may be used. In this case, silicon oxide may be applied onto the silicon substrate.

Further, reaction gas such as argon (Ar) gas may be supplied to the space in the reaction chamber 110 through the gas inlet 112. Another gas such as oxygen or nitrogen gas other than argon (Ar) gas may be injected into the reaction chamber 110. The process pressure in the reaction chamber 110 may be about 0.1 mTorr to about 10 mTorr. The temperature of the substrate during sputtering may be about 500° C. to about 800° C.

Next, power is applied to a target 122 to deposit the transition metal dichalcogenide thin film on the substrate S through a sputtering process (S320). The power applied to the target may be about 20 W to about 60 W. The target 122 may include a precursor including a transition metal and chalcogen. For example, the target 122 may be two or more kinds of precursors including at least one transition metal precursor and at least one chalcogen precursor. The target 122 may be a solid.

The transition metal precursor may include at least one element selected from Ti, Zr, Hf, V, Nb, Ta, Mo, W, Tc, Re, Co, Rh, Ir, Ni, Pd, Pt, Zn, and Sn. For example, the transition metal precursor may include a metal oxide, a metal halide, a metal carbonyl compound, each containing the element, or a combination thereof. The chalcogen precursor may include at least one element selected from S, Se, and Te.

The precursor may further include an element of a Group lower than at least one of the transition metal and the chalcogen in addition to the transition metal and the chalcogen. For example, when Mo is included as the transition metal precursor, the precursor may further include V, Nb, Ta, or Db, which is an element of a Group lower than Mo. Further, when S is included as the chalcogen precursor, the doping element may further include N, P, As, or Sb, which is an element of a Group lower than S. The doped thin film may be formed by the precursor.

When a voltage is applied to the target 122 through the power supply unit 150, sputtering plasma is generated in the reaction chamber 110. In this case, the plasma is composed of (or includes) gamma-electrons, anions, cations, and the like. The sputtering plasma collides with the target 122, and the material sputtered from the target 122 is deposited on the substrate S, thereby forming a thin film.

The thin film (also referred to as layer) formed by sputtering may include a composition represented by Formula 1 below.

$$MX_{(2-a)}Y_a \qquad \text{[Formula 1]}$$

In Formula 1 above, M is a transition metal element, X is a chalcogen element, Y is an element (hereinafter, referred to as "noise element") other than the transition metal element and the chalcogen element, and $0<a<2$ is satisfied.

The transition metal element, for example, may be selected from Ti, Zr, Hf, V, Nb, Ta, Mo, W, Tc, Re, Co, Rh, Ir, Ni, Pd, Pt, Zn, and Sn. The chalcogen element, for example, may be selected from S, Se, and Te. The noise element is an element other than the transition metal element and the chalcogen element, and may be an element such as O, N, or Ar existing in the reaction chamber, or may be an element such as O, CO, C, or H included in the chalcogen precursor. The thin film formed by the above sputtering may be referred to as a transition metal dichalcogenide thin film.

The thickness of the transition metal dichalcogenide thin film may be determined by the energy reaction rate of the sputtered material formed through the size of input power applied to the target, the time during which the input power is applied, process pressure, and substrate temperature. For example, the greater the energy reaction rate of the sputtered material, the greater the thickness of the transition metal dichalcogenide thin film. When the pressure and the substrate temperature are constant, the thickness of the transition metal dichalcogenide thin film may be adjusted depending on the sputtering process time. The sputtering process may be performed for about 20 seconds to about 120 seconds, but is not limited thereto.

As described above, the transition metal dichalcogenide thin film (also referred to as layer) may be deposited on a wide substrate because it is deposited by particles sputtered from the target 122. Further, the thickness of the transition metal dichalcogenide thin film may also be easily adjusted because the energy reaction rate of the material sputtered by adjusting the intensity of power and the application time of power.

In addition, the transition metal dichalcogenide thin film formed by sputtering may include an amorphous material or any polycrystalline material because it is deposited at low temperatures. Further, the sputtered particles may include elements other than transition metals and chalcogen elements included in the precursor, and may be bonded to oxygen or nitrogen existing in the reaction chamber 110 while the sputtered particles are moved from the target 122 to the substrate S. Thus, the transition metal dichalcogenide thin film formed by sputtering may include noise elements other than the transition metal element and the chalcogen element.

In addition, the transition metal dichalcogenide thin film deposited by sputtering may be vertically grown, so that the thickness thereof may not be uniform.

In order to make the thickness of the transition metal dichalcogenide thin film uniform, the transition metal dichalcogenide thin film formed by sputtering may be heat-treated (S330). The substrate S, on which the transition metal dichalcogenide thin film is deposited, may be moved from the sputtering apparatus 100 to the heat treatment apparatus 200. The heat treatment apparatus 200 may generally have a narrower reaction space than the sputtering apparatus 100. The substrate S, on which the transition metal dichalcogenide thin film is deposited, may be disposed or mounted inside the heat treatment apparatus 200, thereby completing a reaction space of the heat treatment apparatus 200. The heat treatment apparatus 200 may heat-treat the transition metal dichalcogenide thin film using a heater 220. The heat treatment temperature may be about 800° C. to about 1200° C. The pressure in the reaction space during the heat treatment may be about 1 torr to about 10 torr.

The heat treatment of the transition metal dichalcogenide thin film may be performed under a chalcogen atmosphere. The chalcogen atmosphere may be formed by supplying a chalcogen-containing gas into the chamber 210 of the heat treatment apparatus 200 or by heating a chalcogen material and using a carrier gas. For example, the chalcogen atmosphere may be formed by supplying a chalcogen-containing gas such as $H_2S$, $H_2Se$ or $H_2Te$ into the chamber 210 of the heat treatment apparatus 200 or by heating a chalcogen material such as sulfur (S), selenium (Se) or tellurium (Te) and using a carrier gas such as argon (Ar) or nitrogen ($N_2$).

The transition metal dichalcogenide thin film may be crystallized by heat-treating the transition metal dichalcogenide thin film. Further, the noise element may be separated from the transition metal dichalcogenide thin film by heat treatment, thereby increasing the purity of the transition metal dichalcogenide thin film TMD. The chalcogen element may be replaced at the site of the separated noise element. Further, since the transition metal dichalcogenide thin film is heat-treated, a part of the material vertically grown by sputtering may be etched to cause lateral growth, thereby making the thickness of the thin film uniform.

The heat-treated transition metal dichalcogenide thin film may include a composition represented by Formula 2 below.

$$MX_2 \quad \text{[Formula 2]}$$

In Formula 2 above, M is a transition metal element, and X is a chalcogen element.

The transition metal element may be selected from Ti, Zr, Hf, V, Nb, Ta, Mo, W, Tc, Re, Co, Rh, Ir, Ni, Pd, Pt, Zn, and Sn, and the chalcogen element may be selected from S, Se, and Te. As some examples, the transition metal dichalcogenide thin film may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, or $ReSe_2$.

The transition metal dichalcogenide thin film formed according to the embodiment may further include a doping element A. For example, doping elements may be included in the precursor. The doping element may be an element of a Group lower than the transition metal element or the chalcogen element. For example, when Mo is included as the transition metal precursor, the doping element may further include V, Nb, Ta, or Db, which is an element of a Group lower than Mo. Further, when S is included as the chalcogen precursor, the doping element may further include N, P, As, or Sb, which is an element of a Group lower than S. A doped thin film may be formed by the above precursor.

In this case, the material of the doped transition metal dichalcogenide thin film TMD may represented by A-doped $MX_2$ or $AMX_2$. $AMX_2$ may be $A_xM_{1-x}X_2$ or $A_xMX_{2-x}$. The doping element A may be Nb, P, Zr, N, V, Ta, As, or Sb. The content of the doping element A may be about 5 wt % or less or about 3 wt % or less.

The transition metal dichalcogenide thin film may be a two-dimensional material. The two-dimensional material is a single-layered or half-layered solid in which atoms form a desired (and/or alternatively predetermined) crystal structure. The two-dimensional material may have a layered structure. Electrostructurally, the two-dimensional material may be defined as a material of which density of state (DOS) follows a quantum well behavior. Since the DOS may also follow a quantum well behavior even in the material in which a plurality of two-dimensional unit material layers (a plurality of single layers) are stacked, in this regard, the structure in which the single layers are repeatedly stacked may also be referred to as a "two-dimensional material". The interlayers of two-dimensional materials may have van der Waals bonds.

According to the above-described embodiments, a transition metal dichalcogenide thin film having uniformity and high quality may be formed in a large area in a short time. Further, the thickness of the transition metal dichalcogenide thin film may be easily adjusted by a sputtering process, and the thickness of the transition metal dichalcogenide thin film may be made uniform by heat treatment. The transition metal dichalcogenide thin film may be formed by performing a sputtering process once and a heat treatment process once, and may also be formed by repeatedly performing a sputtering process several times and a heat treatment process several times. The transition metal dichalcogenide thin film formed by the method according to an embodiment may have a structure of one layer to fifteen layers, but is not limited thereto.

Figure 4:
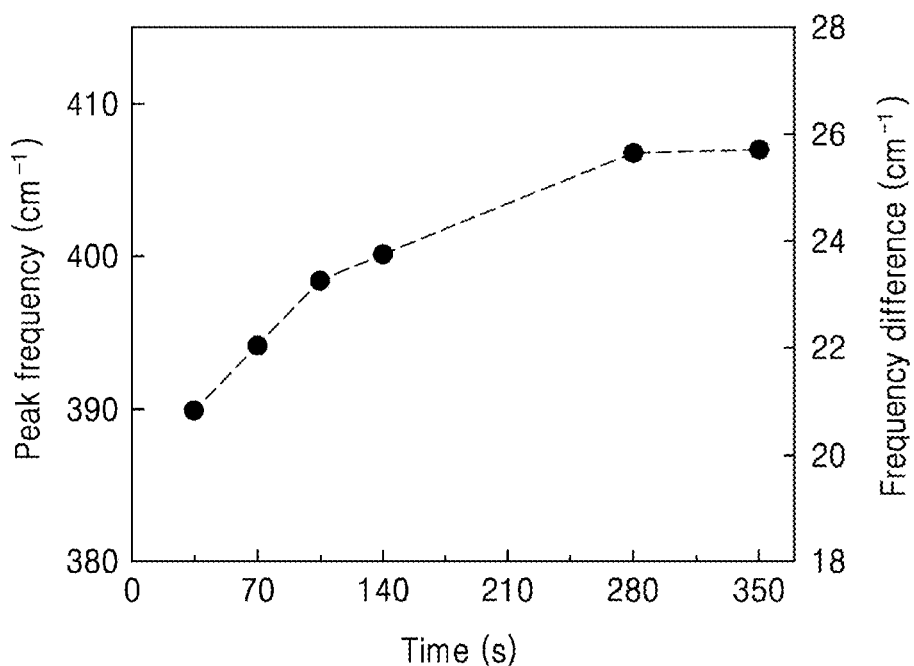
FIG. 4 is a graph showing the Raman spectrum analysis results of the thickness of a thin film over sputtering time according to an embodiment.

FIG. 4 is a graph showing the Raman spectrum analysis results of the thickness of a thin film over sputtering time according to an embodiment. A thin film was deposited using a precursor including Mo and S. The deposition of a thin film was performed while increasing sputtering process time. As shown in FIG. 4, it may be found that a peak frequency increases as sputtering process time increases. The peak frequency is related to the thickness of the thin film, and the increase in the peak frequency means that the thickness of the thin film increases. Although the transition metal dichalcogenide thin film may be formed through a chemical vapor deposition method, there is a difficulty in controlling the thickness thereof. However, the thickness of the transition metal dichalcogenide thin film by the sputtering process according to an embodiment may be easily adjusted by adjusting the sputtering time or the number of sputtering processes.

Figure 5:
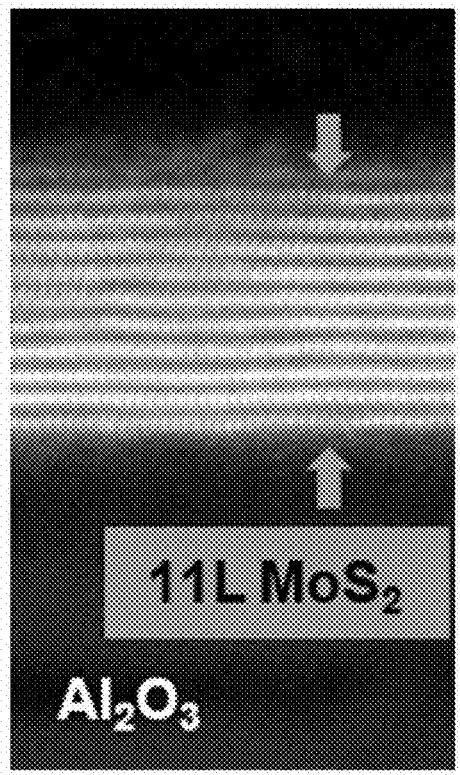
FIG. 5 is a transmission electron microscopy (TEM) image of a $MoS_2$ thin film formed by a process according to an embodiment.

FIG. 5 is a transmission electron microscopy (TEM) image of a $MoS_2$ thin film formed by a process according to an embodiment. What looks like a line at the middle of the TEM image of FIG. 5 is a $MoS_2$ thin film. It may be found that the $MoS_2$ thin film of eleven layers was formed.

Figure 6:
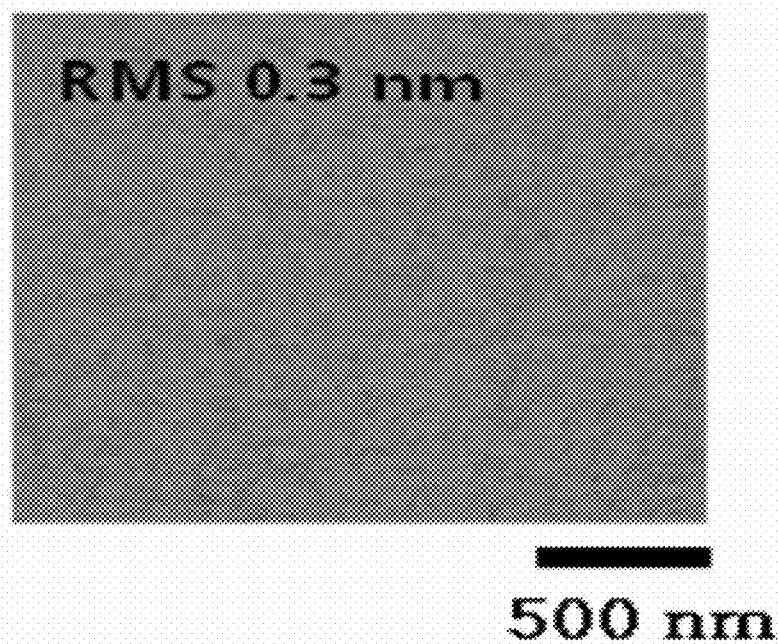
FIG. 6 is a planar image of a transition metal dichalcogenide thin film formed by a process according to an embodiment.

FIG. 6 is a planar image of a transition metal dichalcogenide thin film formed by a process according to an embodiment. A thin film was deposited on a substrate of about 700° C. for 35 seconds using a precursor including Mo and S, and the deposited thin film was heat-treated at about 1000° C. for about 30 minutes. As a result, the planar image of the thin film formed in this way is shown in FIG. 6. As shown in FIG. 6, it may be found that the thin film was formed to have uniform crystals.

Figure 7:
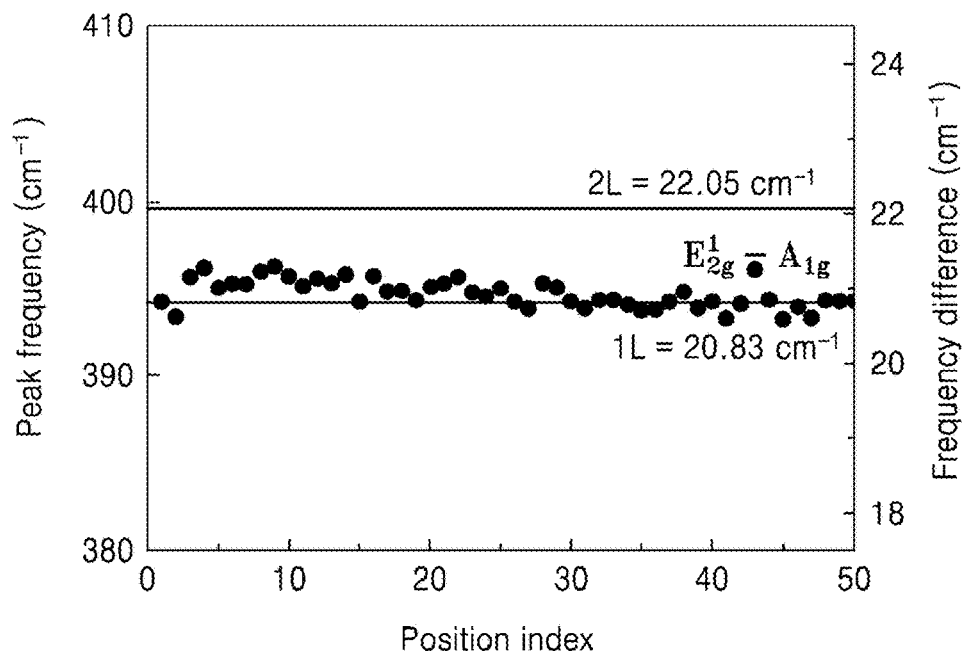
FIG. 7 is a graph showing the Raman spectrum analysis results of a thin film for each position according to an embodiment.

FIG. 7 is a graph showing the Raman spectrum analysis results of a thin film for each position according to an embodiment. The $MoS_2$ thin film was deposited by sputtering, and then heat-treated in a state in which an $H_2S$-containing gas was supplied. As a result, as shown in FIG. 7, it may be found that, in the $MoS_2$ thin film, a peak frequency of a desired (and/or alternatively predetermined) magnitude was observed regardless of a position along the length direction of the thin film. Thus, it may be found that a thin film having uniform thickness was formed regardless of the position of the thin film.

Figure 8:
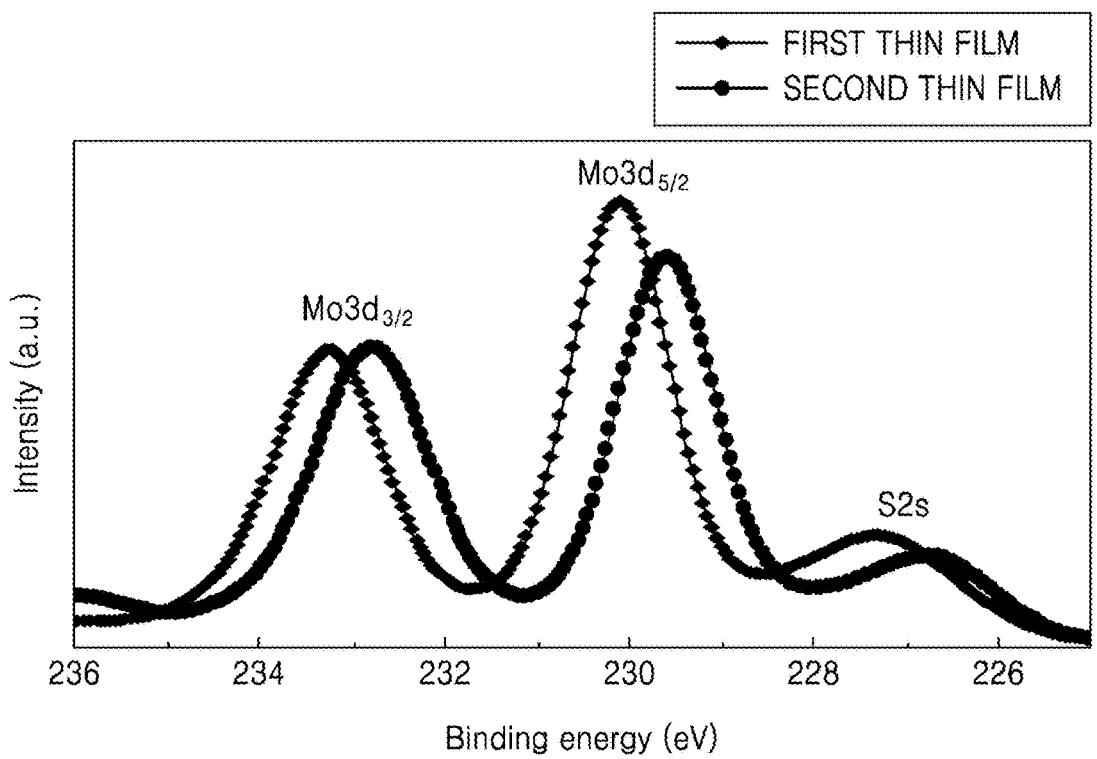
FIG. 8 is a graph showing the experimental results of the formation of an undoped transition metal dichalcogenide thin film and a doped transition metal dichalcogenide thin film.

FIG. 8 is a graph showing the experimental results of the formation of an undoped transition metal dichalcogenide thin film and a doped transition metal dichalcogenide thin film. A first thin film was formed using a first precursor including Mo and S, and a second thin film was formed using a second precursor including Nb, Mo, and S. The content rate of Nb included in the second precursor was about 5%. It may be found that the binding energy of the second thin film is shifted relative to the binding energy of the first thin film. This means that the second thin film was doped. Thus, it may be found that a doped transition metal dichalcogenide thin film may be formed using a sputtering process.

In conventional methods, it is difficult to form a metal chalcogenide thin film on a wafer scale, and it is difficult to ensure uniformity of a continuous film. In order to improve the scalability, a method of using a metal organic precursor has been introduced, but the time required for forming a thin film is about 26 hours, and thus, it is not commercially available. However, according to embodiments of inventive concepts in the present application, it is possible to ensure universal film uniformity, and also to form a high-quality transition metal dichalcogenide thin film in a short time by an easy process.

Figure 9:
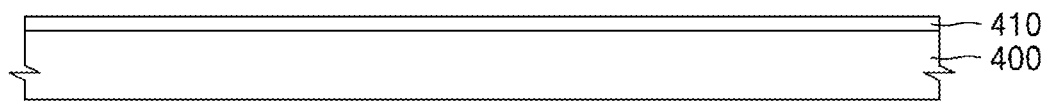
FIGS. 9 and 10 are cross-sectional views showing transition metal dichalcogenide thin films formed by methods according to various embodiments.
Figure 10:
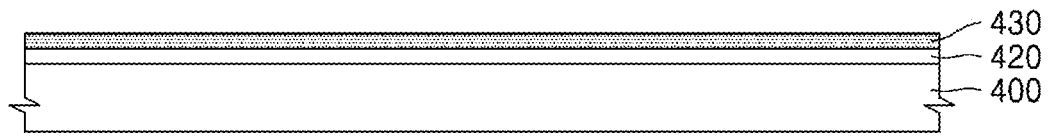

FIGS. 9 and 10 are cross-sectional views showing transition metal dichalcogenide thin films formed by methods according to various embodiments.

Referring to FIG. 9, a transition metal dichalcogenide thin film 410 may be formed on a substrate 400. The transition metal dichalcogenide thin film 410 may include, for example, $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, or $ReSe_2$.

Referring to FIG. 10, a plurality of transition metal dichalcogenide materials different from each other may be formed on the substrate 400 in a multilayer structure. For example, a first transition metal dichalcogenide thin film 420 may be formed on the substrate 400, and a different kind of second transition metal dichalcogenide thin film 430 may be formed on the first transition metal dichalcogenide thin film 420. The first transition metal dichalcogenide thin film 420 may be formed using the method described with reference to FIG. 3, and then the second transition metal dichalcogenide thin film 430 may be formed on the first transition metal dichalcogenide thin film 420 by performing an additional thin film forming process after changing a precursor material (source material). The first transition metal dichalcogenide thin films 420 and the second transition metal dichalcogenide thin films 430 may be alternately and repeatedly stacked. Three or more kinds of transition metal dichalcogenide thin films may be stacked in a desired order.

The above-described method of forming the transition metal dichalcogenide thin film may be applied to methods of manufacturing various devices (a two-dimensional material-containing device). The method of manufacturing a device (a two-dimensional material-containing device) includes: forming a transition metal dichalcogenide thin film on a substrate using the above-described method; and forming an electronic device including the transition metal dichalcogenide thin film.

Here, examples of the device (a two-dimensional material-containing device) may include a transistor, a diode, an optoelectronic device, a tunneling device, a logic device, and a memory device. Examples of the optoelectronic device may include a photoswitch, a photodetector, and a photovoltaic device. Further, in order to control the contact characteristics between a metal and a semiconductor, the transition metal dichalcogenide thin film according to an embodiment may be applied as an insertion layer therebetween. In addition, the transition metal dichalcogenide thin film may be applied for various purposes in various electronic device fields. Moreover, since the method of the embodiment is compatible with Si-based processes, it may be easily applied to existing Si-based processes and devices. Since the transition metal dichalcogenide thin film is able to be easily formed at high throughput when using the method of the embodiment, devices using the transition metal dichalcogenide thin film may be manufactured at high productivity and low cost.

Figure 11A:
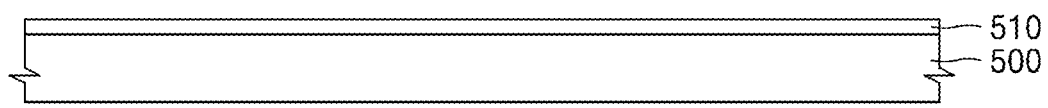
FIGS. 11A to 11C are cross-sectional views illustrating a method of manufacturing a two-dimensional material-containing device, according to an embodiment.
Figure 11B:
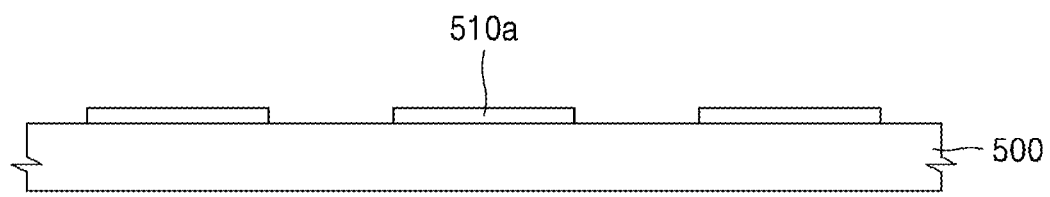
Figure 11C:
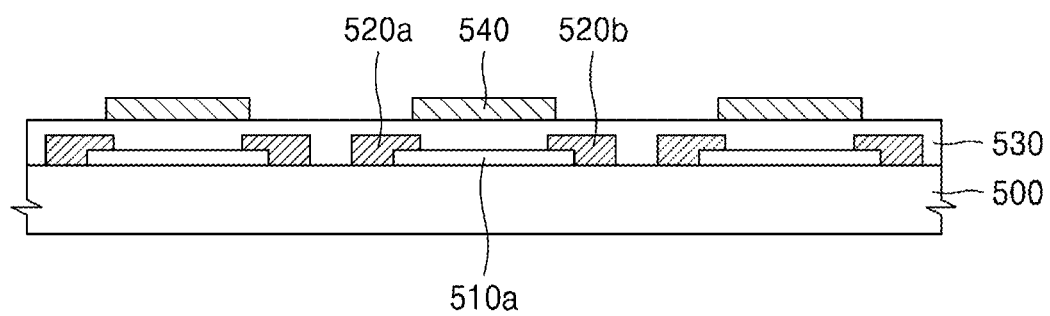

FIGS. 11A to 11C are cross-sectional views illustrating a method of manufacturing a two-dimensional material-containing device, according to an embodiment.

Referring to FIG. 11A, a two-dimensional transition metal dichalcogenide thin film 510 may be formed on a substrate 500. The two-dimensional transition metal dichalcogenide thin film 510 may be formed in a large area on a wafer scale. Here, the substrate 500 may include a growth substrate or a transition substrate.

Referring to FIG. 11B, a patterned transition metal dichalcogenide thin film 510a may be formed by patterning the two-dimensional transition metal dichalcogenide thin film 510. A plurality of patterned transition metal dichalcogenide thin films 510a may be formed.

Referring to FIG. 11C, a device unit including the patterned transition metal dichalcogenide thin films 510a may be formed on the substrate 500. For example, a source electrode 520a and a drain electrode 520b, contacting both ends of the patterned transition metal dichalcogenide thin films 510a, may be formed, a gate insulating layer 530 covering the patterned transition metal dichalcogenide thin films 510a may be formed, and then a gate electrode 540 may be formed on the gate insulating layer 530. Thus, a transistor device including the transition metal dichalcogenide thin film 510a may be manufactured. However, the method of manufacturing the device, described with reference to FIGS. 11A to 11C, is merely an example, and may be variously modified.

It should be understood that embodiments described herein should be considered in a descriptive sense only and not for purposes of limitation. For example, those skilled in the art will appreciate that the method of forming the transition metal dichalcogenide thin film and the method of manufacturing the device using the same may be variously modified. Therefore, the scope of the present disclosure should not be defined by the described embodiments, but should be determined by the following claims.

What is claimed is:

1. A method of forming a thin film of transition metal dichalcogenide, the method comprising:
   providing a substrate in a reaction chamber;
   depositing a transition metal dichalcogenide thin film on the substrate using a sputtering process that uses a precursor and is performed at a first temperature, the precursor including a transition metal and a chalcogen; and
   heat-treating the transition metal dichalcogenide thin film on the substrate at a second temperature under a chalcogen atmosphere, the second temperature being higher than the first temperature, wherein
   the precursor includes a metal oxide, a metal halide, a metal carbonyl compound, or a combination thereof, and
   the heat-treating the transition metal dichalcogenide thin film includes forming the chalcogen atmosphere by providing a chalcogen-containing gas comprising at least one of H$_2$S, H$_2$Se or H$_2$Te.

2. The method of claim 1, wherein the transition metal dichalcogenide thin film includes at least one of an amorphous material and a polycrystalline material.

3. The method of claim 1, wherein the transition metal dichalcogenide thin film includes a composition represented by Formula 1 below:

$$MX_{(2-a)}Y_a \quad \text{[Formula 1]}$$

wherein, in Formula 1 above, M is a transition metal element, X is a chalcogen element, Y is an element other than the transition metal and the chalcogen element, and 0≤a<2 is satisfied.

4. The method of claim 1, wherein
the first temperature is a temperature of about 500° C. to about 800° C.

5. The method of claim 1, wherein
the second temperature is a temperature of about 800° C. to about 1200° C.

6. The method of claim 1, wherein the heat-treating the transition metal dichalcogenide thin film includes forming the chalcogen atmosphere by providing a chalcogen-containing gas.

7. The method of claim 1, wherein a process time for the depositing the transition metal dichalcogenide thin film is less than or equal to 2 minutes.

8. The method of claim 1, wherein the depositing the transition metal dichalcogenide thin film is performed at a pressure of about 0.1 mTorr to about 10 mTorr.

9. The method of claim 8, wherein
the first temperature is a temperature of about 500° C. to about 800° C., and
the second temperature is a temperature of about 800° C. to about 1200° C.

10. The method of claim 1, wherein
the heat-treating the transition metal dichalcogenide thin film provides a heat-treated transition metal dichalcogenide thin film, and
the heat-treated transition metal dichalcogenide thin film has a structure of one layer to fifteen layers.

11. The method of claim 1, wherein a transition metal of the precursor includes at least one of Ti, Zr, Hf, V, Nb, Ta, Mo, W, Tc, Re, Co, Rh, Ir, Ni, Pd, Pt, Zn, and Sn.

12. The method of claim 11,
a transition metal of the precursor includes at least one of Ti, Zr, Hf, V, Nb, Ta, W, Tc, Re, Co, Rh, Ir, Ni, Pd, Pt, Zn, and Sn.

13. The method of claim 1, wherein a chalcogen of the precursor includes at least one element of S, Se, and Te.

14. The method of claim 1, wherein
the heat-treating the transition metal dichalcogenide thin film provides a heat-treated transition metal dichalcogenide thin film, and
the heat-treated transition metal dichalcogenide thin film includes a composition represented by Formula 2 below:

$$MX_2 \quad \text{[Formula 2]}$$

wherein, in Formula 2 above, M is a transition metal element, and X is a chalcogen element.

15. The method of claim 1, wherein the precursor further includes an element of a Group lower than at least one of the transition metal and the chalcogen.

16. The method of claim 15, wherein
the heat-treating the transition metal dichalcogenide thin film provides a heat-treated transition metal dichalcogenide thin film, and
the heat-treated transition metal dichalcogenide thin film is doped.

17. The method of claim 15, wherein a thickness of the transition metal dichalcogenide thin film is proportional to an energy reaction rate of a material sputtered from the precursor.

18. A method of manufacturing an electronic device, the method comprising:
   forming the thin film of transition metal dichalcogenide using the method of claim 1; and
   forming a device unit including the thin film of transition metal dichalcogenide.

19. The method of claim 18, wherein the electronic device includes at least one of a transistor, a diode, an optoelectronic device, a tunneling device, a logic device, and a memory device.

* * * * *